(12) United States Patent
Hikita et al.

(10) Patent No.: US 7,747,123 B2
(45) Date of Patent: Jun. 29, 2010

(54) MANUFACTURING METHOD OF OPTO-ELECTRIC HYBRID BOARD AND OPTO-ELECTRIC HYBRID BOARD OBTAINED THEREBY

(75) Inventors: Takami Hikita, Ibaraki (JP); Kazunori Mune, Ibaraki (JP); Toshiki Naitou, Ibaraki (JP); Yasunari Ooyabu, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 12/358,528

(22) Filed: Jan. 23, 2009

(65) Prior Publication Data

US 2009/0190879 A1 Jul. 30, 2009

Related U.S. Application Data

(60) Provisional application No. 61/028,664, filed on Feb. 14, 2008.

(30) Foreign Application Priority Data

Jan. 24, 2008 (JP) ............................... 2008-013874

(51) Int. Cl.
*G02B 6/12* (2006.01)
*G02B 6/10* (2006.01)
*B29D 11/00* (2006.01)

(52) U.S. Cl. ............................. 385/132; 385/14; 216/24

(58) Field of Classification Search ................... 385/14, 385/132; 216/24
See application file for complete search history.

(56) References Cited

U.S. PATENT DOCUMENTS 6,154,582 A 11/2000 Bazylenko et al.

6,477,284 B1 11/2002 Oda et al.

(Continued)

FOREIGN PATENT DOCUMENTS

EP 1662282 A1 5/2006

(Continued)

OTHER PUBLICATIONS

European Search Report dated Aug. 12, 2009, issued in corresponding European Patent Application No. 09000891.

*Primary Examiner*—Charlie Peng
(74) *Attorney, Agent, or Firm*—Westerman, Hattori, Daniels & Adrian, LLP

(57) ABSTRACT

A method of manufacturing an opto-electric hybrid board which is capable of reducing the number of steps for the manufacture of the opto-electric hybrid board and which achieves the reduction in thickness of the opto-electric hybrid board to be manufactured, and an opto-electric hybrid board obtained thereby. A resist layer is formed on a core-forming resin layer, and is then formed into a predetermined pattern. Resultant portions of the core-forming resin layer serve as cores (optical interconnect lines) 3. Next, a thin metal film 5 is formed on the under cladding layer 2 so as to cover the resist layer and the cores 3. Thereafter, the resist layer is removed together with portions of the thin metal film 5 lying on the surface of the resist layer. Electroplating is performed on the remaining portions of the thin metal film 5 to fill grooves 6 defined between adjacent ones of the cores 3 with electroplated layers 7a obtained by the electroplating. The electroplated layers 7a serve as electrical interconnect lines 7.

3 Claims, 3 Drawing Sheets

U.S. PATENT DOCUMENTS

| | | | |
|---|---|---|---|
| 7,031,586 B2 * | 4/2006 | Kaneko et al. | 385/129 |
| 7,382,960 B2 * | 6/2008 | Ohtsu et al. | 385/130 |
| 2003/0053765 A1 | 3/2003 | Oda et al. | |
| 2004/0005109 A1 | 1/2004 | Tsushima et al. | |
| 2006/0120658 A1 | 6/2006 | Naitou et al. | |
| 2008/0273853 A1 * | 11/2008 | Khan | 385/129 |

FOREIGN PATENT DOCUMENTS

| | | | |
|---|---|---|---|
| JP | 8130353 A | | 5/1996 |
| JP | 2001-7463 A | | 1/2001 |
| JP | 2002116326 A | | 4/2002 |
| JP | 2002-246744 | * | 8/2002 |
| JP | 2002/246744 A | | 8/2002 |
| JP | 2003/084157 A | | 3/2003 |
| JP | 2003-34680 | * | 12/2003 |
| JP | 2007/194476 A | | 8/2007 |
| TW | 270113 B | | 1/2007 |
| WO | 96/33429 A1 | | 10/1996 |

* cited by examiner

PRIOR ART

MANUFACTURING METHOD OF OPTO-ELECTRIC HYBRID BOARD AND OPTO-ELECTRIC HYBRID BOARD OBTAINED THEREBY

RELATED APPLICATIONS

This application claims the benefit of U.S. Provisional Application No. 61/028,664, filed Feb. 14, 2008; which is hereby incorporated by reference.

BACKGROUND OF THE INVENTION

1. Field of the Invention

The present invention relates to a method of manufacturing an opto-electric hybrid board in which an optical waveguide and electrical wiring are combined, and to an opto-electric hybrid board obtained thereby.

2. Description of the Related Art

Recently, information and communications using light as a medium have come into widespread use. An opto-electric hybrid board in which an optical waveguide and electrical wiring are combined (see, for example, Japanese Patent Application Laid-Open No.2001-7463) has accordingly been employed as a board for use in electronic devices for information and communications and the like.

In general, this opto-electric hybrid board is structured such that an electrical wiring board including electrical interconnect lines (conductors) formed in a predetermined pattern and an optical waveguide including cores (optical interconnect lines) formed in a predetermined pattern and serving as a passageway for light are stacked together. An example of the opto-electric hybrid board is shown in FIG. 3. The opto-electric hybrid board B shown in FIG. 3 has a multi-layer structure having two layers in which an optical waveguide $\beta$ is formed on an electrical wiring board $\alpha$. In the above-mentioned electrical wiring board $\alpha$, a plurality of electrical interconnect lines 96 are buried in an insulation layer 95 and are also supported by another insulation layer 94 in that state. In the above-mentioned optical waveguide $\beta$, a plurality of cores 93 are buried in an over cladding layer 98 and are also supported by an under cladding layer 92 in that state.

In the method of manufacturing the above-mentioned conventional opto-electric hybrid board B, however, the process of producing the optical waveguide $\beta$ is performed after the process of producing the electrical wiring board $\alpha$, and each of the processes involves the need for a multiplicity of steps. Thus, it takes a long period of time to manufacture the opto-electric hybrid board B. For example, the patterning of the electrical interconnect lines 96 in the electrical wiring board $\alpha$ involves the need for a large number of steps such as the steps of patterning a resist through exposure, development and the like, plating other portions than the resist, and then removing the above-mentioned resist. The patterning of the cores 93 in the optical waveguide $\beta$ also involves the need for a large number of steps such as exposure, development and the like.

Additionally, the above-mentioned conventional opto-electric hybrid board B has the two-layer structure in which the optical waveguide $\beta$ is stacked on top of the electrical wiring board $\alpha$. Thus, the above-mentioned conventional opto-electric hybrid board B is disadvantageous in reducing the thickness thereof, and cannot respond to recent requests for the reduction in thickness.

In view of the foregoing, it is an object of the present invention to provide a method of manufacturing an opto-electric hybrid board which is capable of reducing the number of steps for the manufacture of the opto-electric hybrid board and which achieves the reduction in thickness of the opto-electric hybrid board to be manufactured, and an opto-electric hybrid board obtained thereby.

To accomplish the above-mentioned object, a first aspect of the present invention is intended for a method of manufacturing an opto-electric hybrid board, which comprising the steps of: forming a core-forming resin layer on an under cladding layer; forming a resist layer on the core-forming resin layer; forming the resist layer and the core-forming resin layer into a predetermined pattern by patterning to form the core-forming resin layer into cores; forming a thin metal film on the under cladding layer with the resist layer and the cores patterned so as to cover the resist layer and the cores; removing the resist layer covered with a portion of the thin metal film together with the portion of the thin metal film; electroplating the remaining portion of the thin metal film lying on side surfaces of the cores patterned to protrude and lying on a portion of the under cladding layer between the cores to fill grooves defined between adjacent ones of the cores with plated layers, thereby causing the plated layers to serve as electrical interconnect lines; and forming an over cladding layer so as to cover the cores and the electrical interconnect lines.

A second aspect of the present invention is intended for an opto-electric hybrid board obtained by the above-mentioned method of manufacturing the opto-electric hybrid board, which comprises: a plurality of protruding cores formed in a predetermined pattern on an under cladding layer; a thin metal film formed over side surfaces of the protruding cores and a surface portion of the under cladding layer except where the protruding cores are formed; electrical interconnect lines including electroplated layers buried in grooves defined between adjacent ones of the protruding cores; and an over cladding layer formed so as to cover the protruding cores and the electrical interconnect lines.

In the method of manufacturing the opto-electric hybrid board according to the present invention, the plurality of protruding cores (optical interconnect lines) are formed in a predetermined pattern, and thereafter the grooves defined between adjacent ones of the cores are filled with the plated layers obtained by the electroplating. The plated layers serve as the electrical interconnect lines (conductors). In other words, the electrical interconnect lines are produced by using the grooves defined between the cores serving as one of the components of an optical waveguide and the like. Thus, the present invention eliminates the need to form a new pattern of the electrical interconnect lines and accordingly reduces the number of steps for the manufacture of the opto-electric hybrid board. As a result, the present invention is capable of reducing the time required for the manufacture of the opto-electric hybrid board to achieve improvements in production efficiency. Further, since the pattern of the electrical interconnect lines is formed by using the pattern of the cores as mentioned above, the positioning accuracy of the cores and the electrical interconnect lines is automatically increased. Additionally, since the above-mentioned electrical interconnect lines are formed by using the grooves defined between the cores of the optical waveguide, the manufactured opto-electric hybrid board has what is called a single-layer structure, and is significantly thinner than the conventional opto-electric hybrid board having a two-layer structure.

When the under cladding layer is formed on the metal base, only the opto-electric hybrid board is easily obtained by removing only the above-mentioned metal base by etching after the opto-electric hybrid board is manufactured on the metal base.

In particular, when the metal base is a base made of stainless steel, the manufacture of the opto-electric hybrid board on the base is accomplished with stability because the base made of stainless steel is excellent in corrosion resistance and in dimensional stability.

The opto-electric hybrid board according to the present invention has what is called a single-layer structure because the electrical interconnect lines are formed by using the grooves defined between adjacent ones of the cores as mentioned above. Thus, the above-mentioned cores and the electrical interconnect lines are formed at the same vertical position. This enables the opto-electric hybrid board according to the present invention to be significantly thinner than the conventional opto-electric hybrid board having a two-layer structure.

DETAILED DESCRIPTION

A preferred embodiment according to the present invention will now be described in detail with reference to the drawings.

Figure 1:
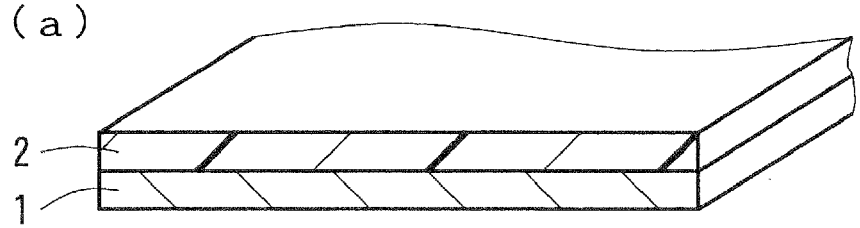
FIGS. 1(a) to 1(d) and FIGS. 2(a) to 2(c) are views schematically illustrating a method of manufacturing an opto-electric hybrid board according to one preferred embodiment of the present invention.
Figure 1:
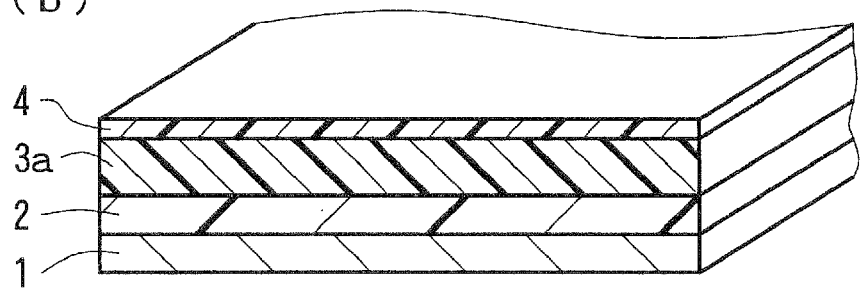
Figure 1:
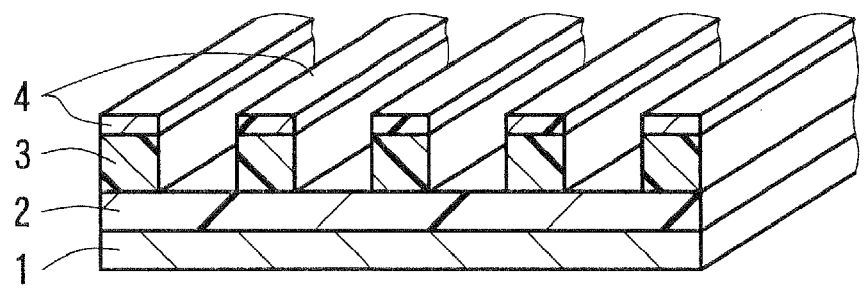
Figure 1:
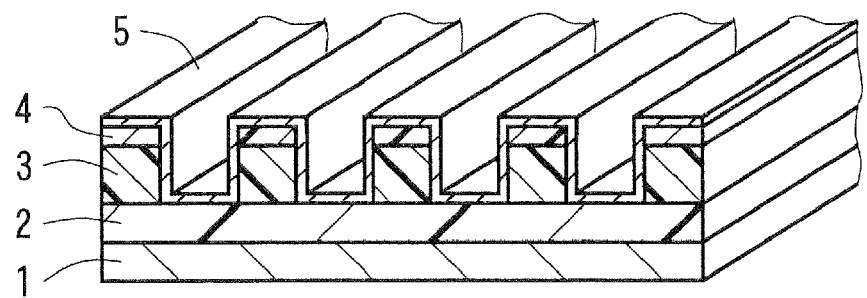
Figure 2:
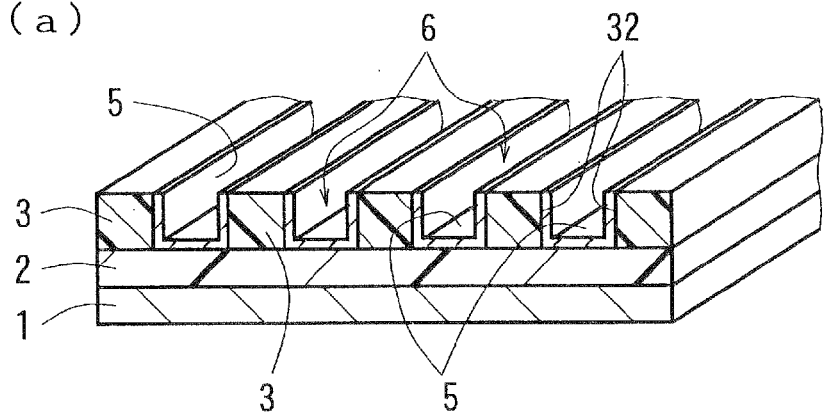
Figure 2:
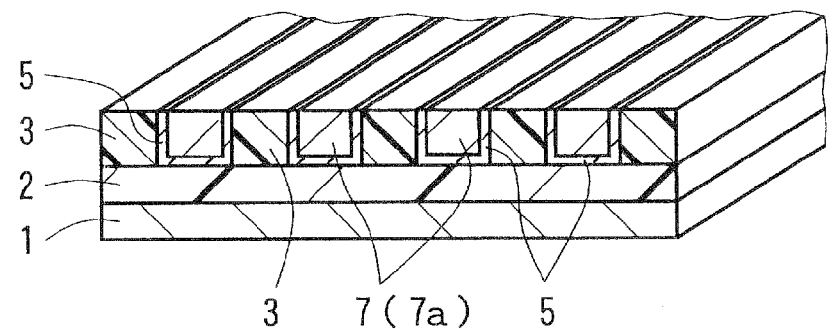
Figure 2:
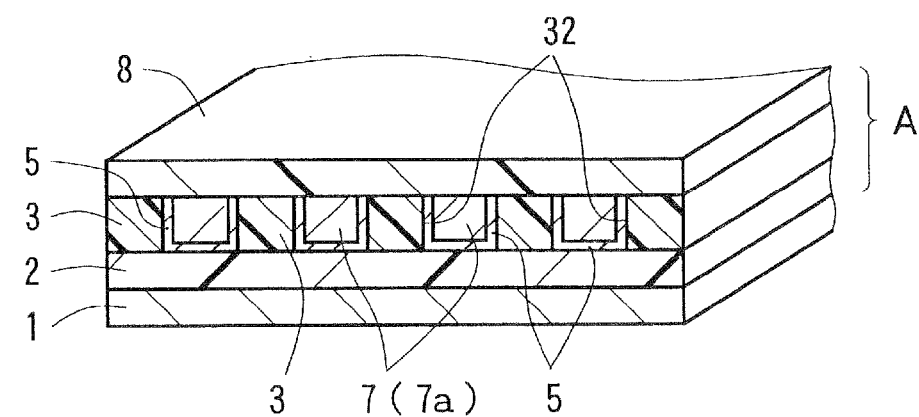

FIGS. 1(a) to (d) and FIGS. 2(a) to (c) illustrate a preferred embodiment of a method of manufacturing an opto-electric hybrid board according to the present invention. In this preferred embodiment, an under cladding layer 2 made of an insulative material is initially formed on the entire top surface of a base 1 in the form of a stainless steel plate and the like (as shown in FIG. 1(a)). Subsequently, a core-forming resin layer 3a made of an insulative material is formed on the under cladding layer 2. Thereafter, a resist layer 4 is formed on the core-forming resin layer 3a (as shown in FIG. 1(b)). Next, the above-mentioned resist layer 4 together with the core-forming resin layer 3a is formed into a predetermined pattern (as shown in FIG. 1(c)). Portions of the core-forming resin layer 3a formed into the predetermined pattern to protrude serve as cores (optical interconnect lines) 3. Subsequently, a thin metal film 5 is formed on the under cladding layer 2 with the above-mentioned patterned resist layer 4 and cores 3 by sputtering, electroless plating or the like so as to cover the resist layer 4 and the cores 3 (as shown in FIG. 1(d)). Thereafter, the above-mentioned resist layer 4 is removed by etching (as shown in FIG. 2(a)). In this process, portions of the thin metal film 5 which are formed on the surface of the resist, layer 4 are also removed together with the above-mentioned resist layer 4. The remaining portions of the thin metal film 5 are formed on a surface portion of the under cladding layer 2 and on opposite side surfaces 32 of the cores 3. By electroplating the remaining portions of the thin metal film 5, grooves 6 defined between adjacent ones of the above-mentioned cores 3 are filled with electroplated layers 7a (as shown in FIG. 2(b)). In this state, the electroplated layers 7a (lying in the grooves 6 defined between adjacent ones of the above-mentioned cores 3 serve as electrical interconnect lines (conductors) 7. Then, an over cladding layer 8 made of an insulative material is formed to cover the above-mentioned cores 3 and the above-mentioned electrical interconnect lines 7 (as shown in FIG. 2(c)). In this manner, an opto-electric hybrid board A having what is called a single layer structure in which the cores (optical interconnect lines) 3 and the electrical interconnect lines (conductors) 7 are arranged alternately is provided. This opto-electric hybrid board A, which is formed on the base 1, is manufactured into a product after the base 1 in the form of a stainless steel plate is removed by treatment with an acid and the like or manufactured into a product together with the base 1.

In this opto-electric hybrid board A, the under cladding layer 2, the cores 3 and the over cladding layer 8 constitute an optical waveguide, and the electrical interconnect lines 7 are formed in the grooves 6 defined between the cores 3. The electrical interconnect lines 7, which are formed by utilizing the insulating properties of the under cladding layer 2, the cores 3 and the over cladding layer 8, are highly reliable. Also, the thin metal film 5 is formed on the opposite side surfaces 32 of the cores 3, and may be used to function as a surface for reflecting light beams. This further ensures the propagation of light beams.

The above will be described in further detail. The base 1 on which the above-mentioned under cladding layer 2 is formed (as shown in FIG. 1(a)) has a flat shape, and a metal plate such as the above-mentioned stainless steel plate is used for the base 1. The material of the base 1, however, is not limited to this. Examples of the material of the base 1 used herein may include glass, quartz, silicon, synthetic resins and the like. The thickness of the base 1 is, for example, in the range of 20 μm (for a film-like base 1) to 5 mm (for a plate-like base 1).

The formation of the above-mentioned under cladding layer 2 (as shown in FIG. 1(a)) is carried out, for example, in a manner to be described below. First, a varnish prepared by dissolving a photosensitive resin (a highly insulative resin) conventionally known in the art in a solvent is applied onto the above-mentioned base 1, and is then dried by a heating treatment to thereby form a photosensitive resin layer. Next, the photosensitive resin layer is exposed to irradiation light, and a heating treatment is performed on the exposed photosensitive resin layer, whereby a photoreaction is completed. This forms the above-mentioned photosensitive resin layer into the under cladding layer 2. The thickness of the under cladding layer 2 (the photosensitive resin layer) is typically in the range of 10 to 1000 μm.

For the formation of the above-mentioned under cladding layer 2, the application of the above-mentioned varnish is achieved, for example, by a spin coating method, a dipping method, a casting method, an injection method, an ink jet method and the like. The subsequent drying by the heating treatment is performed at 50° C. to 120° C. for 10 to 30 minutes. Examples of the irradiation light for the above-mentioned exposure used herein include visible light, ultraviolet light, infrared light, X-rays, alpha rays, beta rays, gamma rays and the like. Preferably, ultraviolet light is used. This is because the use of ultraviolet light achieves irradiation with large energy to provide a high rate of hardening, and an irradiation apparatus therefor is small in size and inexpensive to achieve the reduction in production costs. A light source of the ultraviolet light may be, for example, a low-pressure mercury-vapor lamp, a high-pressure mercury-vapor lamp, an ultra-high-pressure mercury-vapor lamp and the like. The dose of the ultraviolet light is typically 10 to 10000 mJ/cm$^2$, preferably 50 to 3000 mJ/cm$^2$. The subsequent heating treatment is performed at 80° C. to 250° C., preferably at 100° C. to 200° C., for 10 seconds to two hours, preferably for five minutes to one hour.

The formation of the core-forming resin layer 3a (with reference to FIG. 1(b)) which is the subsequent step is carried out, for example, by forming a photosensitive resin layer in a manner similar to the photosensitive resin layer in the step of forming the under cladding layer 2. The material for the formation of the core-forming resin layer 3a (the cores 3) used herein is a material having a refractive index greater than that of the materials for the formation of the above-mentioned under cladding layer 2 and the over cladding layer 8 to be described later (as shown in FIG. 2(c)). The adjustment of this refractive index may be made, for example, by adjusting the selection of the types of the materials for the formation of the above-mentioned under cladding layer 2, the cores 3 and the over cladding layer 8 and the composition ratio thereof. The thickness of the core-forming resin layer 3a is typically in the range of 10 to 100 μm.

In this preferred embodiment, a photosensitive photoresist is used as the material for the formation of the above-mentioned resist layer 4 to be formed subsequently (with reference to FIG. 1(b)). The formation of the above-mentioned resist layer 4 is carried out by applying the above-mentioned photoresist onto the core-forming resin layer 3a and then drying the photoresist by a heating treatment. The application of the above-mentioned photoresist is achieved, for example, by a spin coating method, a dipping method, a casting method, an injection method, an ink jet method and the like. Alternatively, a dry film resist may be bonded The thickness of the above-mentioned resist layer 4 is typically in the range of 10 to 30 μm.

The patterning of the above-mentioned core-forming resin layer 3a and the resist layer 4 (with reference to FIG.(c)), which is the subsequent step, is carried out, for example, in a manner to be described below. First, the above-mentioned resist layer 4 is exposed to irradiation light through an exposure mask formed with an opening pattern corresponding to the pattern of the cores 3 in a manner similar to the step of forming the above-mentioned under cladding layer 2. Also, the above-mentioned core-forming resin layer 3a is exposed to the irradiation light passing through the resist layer 4. Thereafter, a heating treatment is performed. Next, development is performed using a developing solution to dissolve away unexposed portions. This causes portions of the core-forming resin layer 3a remaining on the under cladding layer 2 to be formed into the pattern of the cores 3, and causes the resist layer 4 to remain on the remaining portions of the core-forming resin layer 3a. Thereafter, a heating treatment is performed to remove the developing solution in the remaining portions of the core-forming resin layer 3a and the developing solution in the resist layer 4. Thus, the above-mentioned remaining portions of the core-forming resin layer 3a are formed into the cores 3. The width of the cores 3 is typically in the range of 8 to 50 μm For the patterning of the above-mentioned cores 3 and the like, the above-mentioned development employs, for example, an immersion method, a spray method, a puddle method and the like. Examples of the developing solution used herein include an organic solvent, an organic solvent containing an alkaline aqueous solution, and the like. The developing solution and conditions for the development are selected as appropriate depending on the composition of the photosensitive resin composition of the core-forming resin layer 3a and the resist layer 4. The heating treatment after the above-mentioned development is typically performed at 80° C. to 120° C. for 10 to 30 minutes.

The above-mentioned thin metal film 5 to be formed subsequently (with reference to FIG. 1(d)) is a metal layer for use as a cathode during the electroplating to be performed later (with reference to FIG. 2(b)). Examples of the metal material of the above-mentioned thin metal film 5 include chromium, copper and the like. The thickness of the above-mentioned thin metal film 5 is typically in the range of 600 to 2600 Å.

The removal of the above-mentioned resist layer 4 by etching (with reference to FIG. 2(a)), which is the subsequent step, is carried out to leave the thin metal film 5 only in the grooves 6 defined between adjacent ones of the cores 3. This is because, if portions of the thin metal film 5 are left unremoved on the surface of the resist layer 4, the electroplated layers 7a (are formed on the portions of the thin metal film 5 lying on the surface of the resist layer 4 by electroplating to be performed later (with reference to FIG. 2(b)) so that the electroplated layers 7a (the electrical interconnect lines 7) lying in the grooves 6 defined between adjacent ones of the cores 3 are short-circuited. The above-mentioned etching is performed by immersing the entire structure (the structure shown in FIG. 1(d)) in an etchant to cause the etchant to penetrate through an end surface (an exposed surface) of the resist layer 4 into the resist layer 4, thereby removing the resist layer 4. During the above-mentioned etching, the portions of the thin metal film 5 lying on the surface of the resist layer 4 to be removed are removed simultaneously with the removal of the resist layer 4 because those portions of the thin metal film 5 are no longer supported by the resist layer 4. Examples of the above-mentioned etchant include aqueous sodium hydroxide solutions and the like.

The above-mentioned electroplating (with reference to FIG. 2(b)) after the above-mentioned etching is performed by applying a voltage to a plating bath, with the above-mentioned thin metal film 5 used as a cathode in the plating bath. This forms the electroplated layers 7a obtained by the electroplating on the surface of the above-mentioned thin metal film 5. Examples of the metal material of the electroplated layers 7a formed by the above-mentioned electroplating include copper, nickel, gold, tin and the like. Via-filling plating is preferable as the above-mentioned electroplating. This is because the via-filling plating is suitable for filling the grooves 6 defined between adjacent ones of the cores 3 (with reference to FIG. 2(a)) with the electroplated layers 7a. The electroplated layers 7a (in the above-mentioned grooves 6 may incompletely fill the grooves 6 or be raised from the top end surface of the grooves 6.

The formation of the over cladding layer 8 (with reference to FIG. 2(c)) after the above-mentioned electroplating is carried out in a manner similar to the formation of the above-mentioned under cladding layer 2. Specifically, a photosensitive resin layer is formed so as to cover the above-mentioned cores 3 and the above-mentioned electrical interconnect lines 7. Thereafter, exposure to light and a heating treatment are performed to form the above-mentioned photosensitive resin layer into the over cladding layer 8. The thickness of the over cladding layer 8 (the photosensitive resin layer) is typically in the range of 10 to 1000 μm.

In this manner, the opto-electric hybrid board A is manufactured on the base 1 (as shown in FIG. 2(c)). As described above, the opto-electric hybrid board A may be used while being provided on the base 1 or be used after the base 1 is separated therefrom or removed therefrom by etching and the like.

Figure 3:
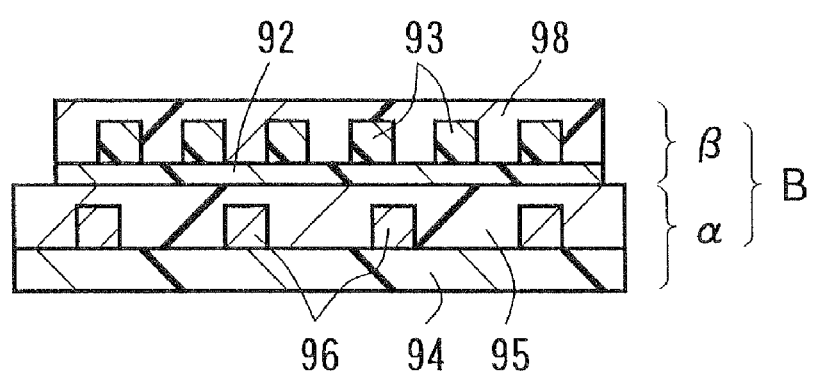
FIG. 3 is a view schematically illustrating a conventional opto-electric hybrid board.

In the above-mentioned opto-electric hybrid board A, the optical waveguide includes the plurality of cores 3, and the under cladding layer 2 and over cladding layer 8 which hold the cores 3 therebetween from below and from above. Also, the electrical interconnect lines 7 are formed between adjacent ones of the cores 3 in the optical waveguide. In other words, the above-mentioned opto-electric hybrid board A has a structure such that the electrical interconnect lines (conductors) 7 are flush with (in the same layer as) the cores (optical interconnect lines) 3 in the optical waveguide. Thus, the above-mentioned opto-electric hybrid board A is significantly thinner than the conventional opto-electric hybrid board B (see FIG. 3) having the two-layer structure. Further, since the thin metal film 5 is formed on the opposite side surfaces 32 of the cores 3 as stated above, the thin metal film 5 may be used to function as a surface for reflecting light beams propagating through the cores 3. This further ensures the propagation of the light beams. Additionally, the electrical interconnect lines 7 are prevented from being short-circuited because the under cladding layer 2, the cores 3 and the over cladding layer 8 disposed around each of the electrical interconnect lines 7 are insulators constituting the above-mentioned optical waveguide.

The patterning of the cores 3 and the resist layer 4 is achieved by the exposure to light, the development and the like in the above-mentioned preferred embodiment. This patterning, however, may be achieved by other methods, for example by cutting using a rotary blade and the like. In this case, the materials for the formation of the cores 3 and the resist layer 4 are not limited to the photosensitive materials but may be thermosetting resins and the like.

The resist layer 4 and the portions of the thin metal film 5 lying on the top surface of the resist layer 4 are removed by etching using an etchant in the above-mentioned preferred embodiment. This removal, however, may be achieved by other methods, for example by a physical method such as polishing and the like.

In the above-mentioned preferred embodiment, the formation of the under cladding layer 2 and the over cladding layer 8 uses the photosensitive resin as the materials thereof, and is achieved by the exposure to light and the like. However, other materials and other methods may be used. As an example, the formation of the under cladding layer 2 and the over cladding layer 8 may use a thermosetting resin such as polyimide resin and epoxy resin as the materials thereof, and may be achieved by applying a varnish prepared by dissolving the thermosetting resin in a solvent and then performing a heating treatment (typically at 300° C. to 400° C. for 60 to 180 minutes) to set the varnish or by other methods. A resin film may be used as the under cladding layer 2 and the over cladding layer 8.

Next, an example of the present invention will be described. It should be noted that the present invention is not limited to the example.

EXAMPLE

Material for Formation of Under Cladding Layer and Over Cladding Layer

A material for formation of an under cladding layer and an over cladding layer was prepared by mixing 35 parts by weight of bisphenoxyethanol fluorene glycidyl ether (component A) represented by the following general formula (1), 40 parts by weight of 3',4'-epoxycyclohexylmethyl-3,4-epoxycyclohexane carboxylate which is an alicyclic epoxy resin (CELLOXIDE 2021P manufactured by Daicel Chemical Industries, Ltd.) (Component B), 25 parts by weight of (3',4'-epoxycyclohexane)methyl-3',4'-epoxycyclohexyl-carboxylate(CELLOXIDE 2081 manufactured by Daicel Chemical Industries, Ltd.) (Component C), and one part by weight of a 50% propione carbonate solution of 4,4'-bis [di(β-hydroxyethoxy)phenylsulfinio]phenyl-sulfide-bis-hexafluoroantimonate (component D).

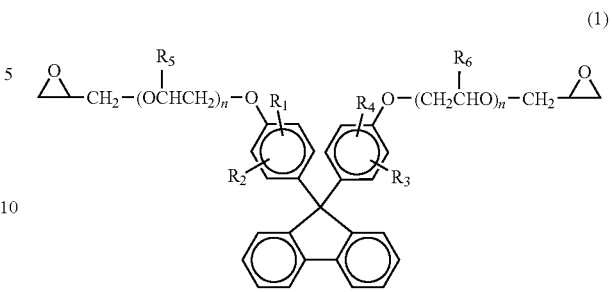

(1)

wherein $R_1$ to $R_6$ are hydrogen atoms, and $n=1$.

Material for Formation of Cores

A material for formation of cores was prepared by dissolving 70 parts by weight of the aforementioned component A, 30 parts by weight of 1,3,3-tris{4-[2-(3-oxetanyl)]butoxyphenyl}butane and one part by weight of the aforementioned component D in 28 parts by weight of ethyl lactate.

Manufacture of Opto-Electric Hybrid Board

The material for the formation of the above-mentioned under cladding layer was applied to the surface of a base made of stainless steel (having a thickness of 20 μm) by a spin coating method, and was then dried by a heating treatment at 100° C. for 15 minutes. Then, exposure by the use of irradiation with ultraviolet light at 2000 mJ/cm² was performed through a photomask (exposure mask) formed with a desired opening pattern. Next, a heating treatment was performed at 100° C. for 15 minutes to form the under cladding layer. The thickness of this under cladding layer was 25 μm when measured with a contact-type film thickness meter. The refractive index of this under cladding layer at a wavelength of 830 nm was 1.542.

Next, the material for the formation of the above-mentioned cores was applied to the surface of the above-mentioned under cladding layer by a spin coating method, and was then dried by a heating treatment at 100° C. for 15 minutes, whereby a core-forming resin layer was formed. Subsequently, a photoresist was applied onto the core-forming resin layer by a spin coating method, and was then dried by a heating treatment, whereby a resist layer (having a thickness of 20 μm) was formed. Next, a photomask formed with an opening pattern identical in shape with a core pattern was placed over the resist layer. Then, exposure by the use of irradiation with ultraviolet light at 4000 mJ/cm² was performed by a contact exposure method from over the mask. Thereafter, a heating treatment was performed at 120° C. for 30 minutes. Next, development was carried out using an aqueous solution of γ-butyrolactone to dissolve away unexposed portions of the above-mentioned resist layer and the core-forming resin layer. Thereafter, a heating treatment was performed at 120° C. for 30 minutes. This formed remaining portions of the core-forming resin layer in a predetermined pattern into the cores. When measured with an SEM (electron microscope), the dimensions of the cores in cross section were 50 μm in width×50 μm in height, and a spacing between adjacent ones of the cores was 50 μm. The refractive index of the cores at a wavelength of 830 nm was 1.588.

Next, a thin metal film (having a thickness of 1500 Å) made of an alloy of chromium and copper was formed by sputtering over the under cladding layer with the resist layer and the cores which were patterned so as to cover the resist layer and the cores. Thereafter, the resist layer together with the thin metal film formed on the surface of the resist layer was removed by immersion in an etchant of an aqueous sodium hydroxide solution. Then, electroplating was performed on the surface of the remaining portions of the thin metal film (portions of the thin metal film on a surface portion of the under cladding layer and on the opposite side surfaces of the cores) to form electroplated layers made of copper, thereby filling grooves defined between adjacent ones of the cores with the above-mentioned electroplated layers. Then, the electroplated layers were used to function as electrical interconnect lines.

Then, the over cladding layer was formed so as to cover the above-mentioned cores and the above-mentioned electrical interconnect lines in a manner similar to the formation of the above-mentioned under cladding layer. The thickness of the over cladding layer was 25 µm when measured with a contact-type film thickness meter. The refractive index of the over cladding layer at a wavelength of 830 nm was 1.542.

In this manner, an opto-electric hybrid board in which the cores (optical interconnect lines) and the electrical interconnect lines (conductors) were arranged alternately at the same vertical position and in which the under cladding layer and the over cladding layer were disposed under and over the alternating cores and electrical interconnect lines was manufactured on the base.

Although a specific form of embodiment of the instant invention has been described above and illustrated in the accompanying drawings in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. A method of manufacturing an opto-electric hybrid board, comprising the steps of:
    forming a core-forming resin layer on an under cladding layer;
    forming a resist layer on the core-forming resin layer;
    forming the resist layer and the core-forming resin layer into a predetermined pattern by patterning to form the core-forming resin layer into cores;
    forming a thin metal film on the under cladding layer with the resist layer and the cores patterned so as to cover the resist layer and the cores;
    removing the resist layer covered with a portion of the thin metal film together with the portion of the thin metal film;
    electroplating the remaining portion of the thin metal film lying on side surfaces of the cores patterned to protrude and lying on a portion of the under cladding layer between the cores to fill grooves defined between adjacent ones of the cores with plated layers, thereby causing the plated layers to serve as electrical interconnect lines; and
    forming an over cladding layer so as to cover the cores and the electrical interconnect lines.

2. The method according to claim 1, wherein the under cladding layer is formed on a metal base.

3. The method according to claim 2, wherein the metal base is a base made of stainless steel.

* * * * *